United States Patent [19]

Okada

[11] Patent Number: 5,379,410
[45] Date of Patent: Jan. 3, 1995

[54] DATA GENERATING APPARATUS GENERATING CONSECUTIVE DATA AND HAVING A DATA SKIP SCHEME AND A METHOD OF OPERATING THE SAME

[75] Inventor: Keisuke Okada, Hyogo, Japan

[73] Assignee: Mitsubishi Denki Kabushiki Kaisha, Tokyo, Japan

[21] Appl. No.: 709,857

[22] Filed: Jun. 4, 1991

[30] Foreign Application Priority Data

Jun. 6, 1990 [JP] Japan ................... 2-148931

[51] Int. Cl.$^6$ ............................................. G06F 12/02
[52] U.S. Cl. ................... 395/575; 364/943.9; 364/DIG. 2; 364/DIG. 1; 364/944.91; 395/425
[58] Field of Search ... 364/200 MS File, 900 MS File; 395/425, 575

[56] References Cited

U.S. PATENT DOCUMENTS

| | | | |
|---|---|---|---|
| 3,995,257 | 11/1976 | Iki ......................................... | 395/775 |
| 4,429,361 | 1/1984 | Maccianti et al. ................... | 395/775 |
| 4,458,332 | 7/1984 | Heidt ................................... | 395/650 |
| 4,498,146 | 2/1985 | Martinez ............................. | 395/425 |
| 4,514,804 | 4/1985 | Kimoto ............................... | 395/375 |
| 4,792,917 | 12/1988 | Takamatsu et al. ................ | 395/425 |
| 5,119,291 | 6/1992 | Flannagan et al. ................ | 395/275 |
| 5,200,959 | 4/1993 | Gross et al. ......................... | 371/21.6 |
| 5,249,279 | 9/1993 | Schmenk et al. ................... | 395/425 |

OTHER PUBLICATIONS

Mano, Computer System Architecture, 2nd ed., 1982, pp. 21-35.
"Principles of CMOS VLSI Design" by Neil H. E. Weste and Kamran Eshraghian, pp. 336-338.

*Primary Examiner*—Joseph L. Dixon
*Attorney, Agent, or Firm*—Lowe, Price, LeBlanc & Becker

[57] ABSTRACT

A data generating apparatus for sequentially generating data includes a binary counter, a setting circuit, a match detecting circuit, and a selector group. The binary counter responds to a clock signal for sequentially generating data. The setting circuit sets a data preceding the data to be skipped. The match detecting circuit detects a match of the data set by the setting circuit with the data generated by the binary counter. The selector group supplies "1" to the binary counter when a match is not detected by the match detecting circuit, and "2" to the binary counter when a match is detected by the match detecting circuit. The binary counter adds "2" to the preceding data when a match is detected by the match detecting circuit to skip the desired data.

26 Claims, 10 Drawing Sheets

MATCH SIGNAL

DATA GENERATING APPARATUS GENERATING CONSECUTIVE DATA AND HAVING A DATA SKIP SCHEME AND A METHOD OF OPERATING THE SAME

BACKGROUND OF THE INVENTION

1. Field of the Invention

The present invention relates to data generating apparatus, and more particularly, to a data generating apparatus for sequentially generating consecutive data, and a method of operating the same.

2. Description of the Background Art

Large memory capacity is required for memories of computers and image processing devices in accordance with the development of recent techniques. Random access memories (RAM) are used for the memories of such computers, and sequential memories are used for image processing devices.

A RAM is supplied with an arbitrary address signal, whereby access is carried out with respect to the arbitrary address. A sequential memory is supplied with address signals incremented by "1", whereby sequential access is carried out with respect to consecutive addresses.

FIG. 13 is a schematic block diagram of a one-chip sequential memory device. Referring to FIG. 13, the sequential memory device comprises a timing generating circuit 90, a binary counter 100, and a sequential memory 6. Timing generating circuit 90 responds to an externally applied clock signal CLK1 to generate a clock signal CLK2 for controlling the address data output timing of binary counter 100, and a read/write specifying signal R/W for specifying the reading or the writing of sequential memory 6. Binary counter 100 responds to clock signal CLK2 to sequentially increment an address data by "1". In response to read/write specifying signal R/W and the updated address data, an externally applied data is written into sequential memory 6 sequentially. Later on, data stored in sequential memory 6 is read out to an external source sequentially.

FIG. 14 is a block diagram of a conventional binary counter of 3-bit structure described in "PRINCIPLES OF CMOS VLSI DESIGN" by Neil H. E. Weste, Kamran Eshraghian, ADDISON-WESLEY PUBLISHING COMPANY, p. 338. Referring to FIG. 14, the binary counter comprises adders 11, 12, and 13, and D type flipflop circuits (hereinafter referred to as D-FF) 21, 22, and 23. The outputs of D-FFs 21, 22 and 23 are provided to the address terminal of the sequential memory.

FIG. 15 is the circuit diagram of the aforementioned adder. Referring to FIG. 15, the adder comprises input terminals A and B, a carry input terminal Ci, a sum output terminal S for providing the summed result, a carry output terminal Co, inverters $1a$, $1b$, $1e$, $1f$, and $1g$ and $in$, and complementary MOSFETs $1c$, $1d$, $1h$, $1j$ and $1k$. The above mentioned adder carries out adding processing. That is to say, when the signals at input terminals A and B are both "1", the output Co becomes "1" regardless of carry input Ci. When the signals at input terminals A and B are both "0", carry output Co is "0" regardless of carry input Ci. When either the signal at input terminal A or B is "0", the preceding logic state is maintained.

The operation of the binary counter 100 of FIGS. 14 and 15 will be explained hereinafter.

The potential of input terminal B of adder 11 among the adders 11, 12, 13 is always at the high level, while the potentials of input terminal B of adders 12 and 13 are always at the low level. Adder 11 therefore adds "1" to the preceding state every time an output signal is applied to input terminal A from D-FF21. Every time the added result is "0", a carry flag is provided from carry output terminal Co to adder 12 of the more significant bit. Adder 12 provides a carry flag to adder 13 of the more significant bit every time the summed result is "0". The aforementioned plurality of adders are called ripple adders because carry bits are operated in a chained manner.

D-FFs 21, 22, and 23 are responsive to the input of the clock signal CLK2 to provide the summed result to the sequential memory, as well as to input terminals A of adders 11, 12 and 13.

Thus, the address of the sequential memory can be specified with a serial number by using a binary counter incrementing "1" to the preceding logic state.

A binary counter can be used in the RAM of a computer if the address is counted sequentially (for example, program counter).

If there is a faulty bit in the address of the sequential memory, the address with the faulty bit will be specified because "1" is incremented to the preceding logic state in the binary counter of the aforementioned structure. If there is an error bit in a region of the sequential memory, it is necessary to exchange the entire sequential memory, even if there are no faulty bits in other regions.

SUMMARY OF THE INVENTION

An object of the present invention is to allow skipping of desired data in a data generating apparatus sequentially generating data.

Another object of the present invention is to allow skipping of desired address data in an address data generating apparatus sequentially generating an address data.

A further object of the present invention is to allow skipping of desired address in specifying an address in a sequential memory device.

A still further object of the present invention is to alter data not only consecutively, but also nonconsecutively in a data generating apparatus.

Yet another object of the present invention is to eliminate the need of exchanging a sequential memory even if there is an error bit in the memory.

Still another object of the present invention is to facilitate the skipping of an address of an error bit in a sequential memory.

Briefly stated, a data generating apparatus according to the present invention includes a data generator, a setting device, a detecting device, and an altering device. The data generator is responsive to a clock signal for sequentially generating data. The setting device sets in advance data having a constant relation to the data to be skipped. The detecting device detects a predetermined relation between the data generated by the data generator and the data set by the setting device. The altering device alters the data to be generated from the data generator by a first value when the predetermined relation is not detected by the detecting device, and alters the data to be generated from the data generator by a second value which is greater than the first value when the predetermined relation is detected by the detecting device.

In operation, the data generated from the data generator is sequentially altered by a first value by the altering device until the data generated from the data generator establishes a predetermined relation with the data set by the setting device. When the predetermined relation is established between the generated data and the set data, the detecting device detects this relation, whereby the next data to be generated is altered by a second value by the altering device. Because the second value is greater than the first value, the desired data can be skipped.

The address including an error bit can be skipped by employing a data generator of the sequential memory device as the address generating device. This eliminates the need of exchanging a memory even if there is an error bit in an address of a portion of the sequential memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
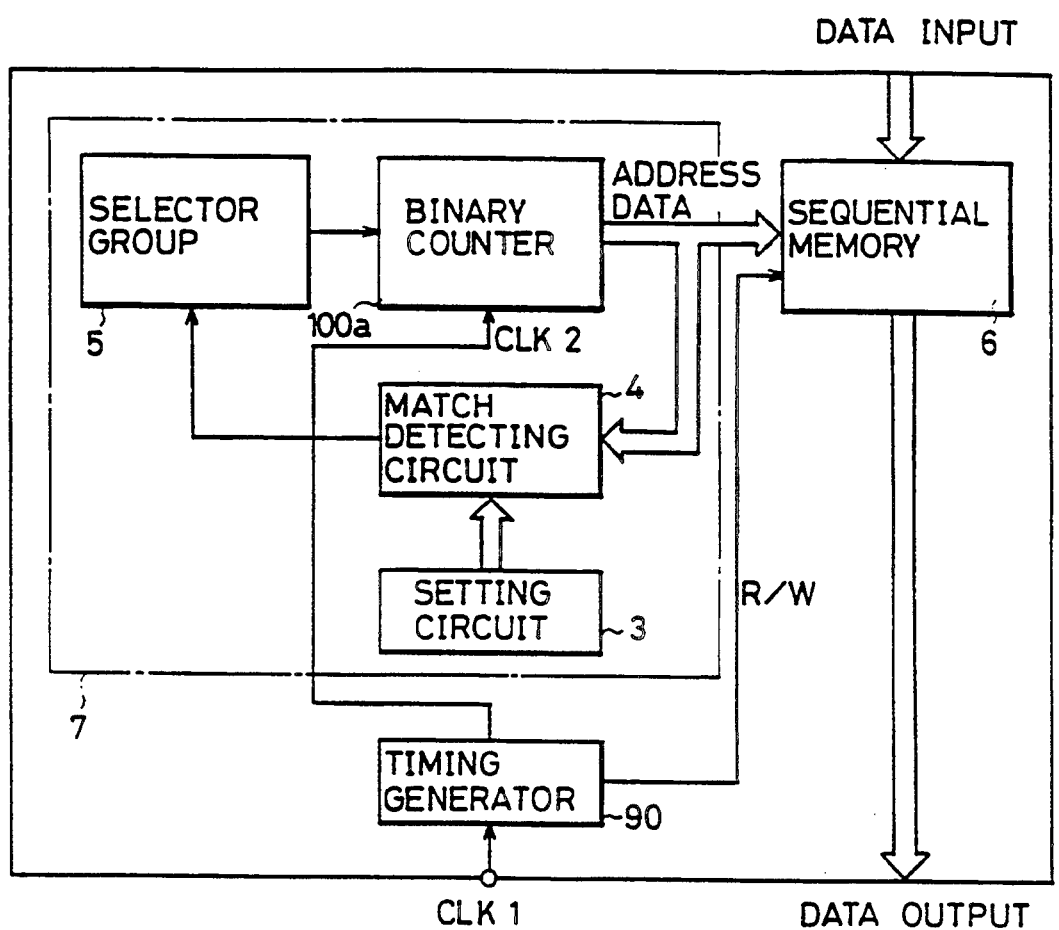
FIG. 1 is a block diagram showing an embodiment of the present invention.
Figure 13:
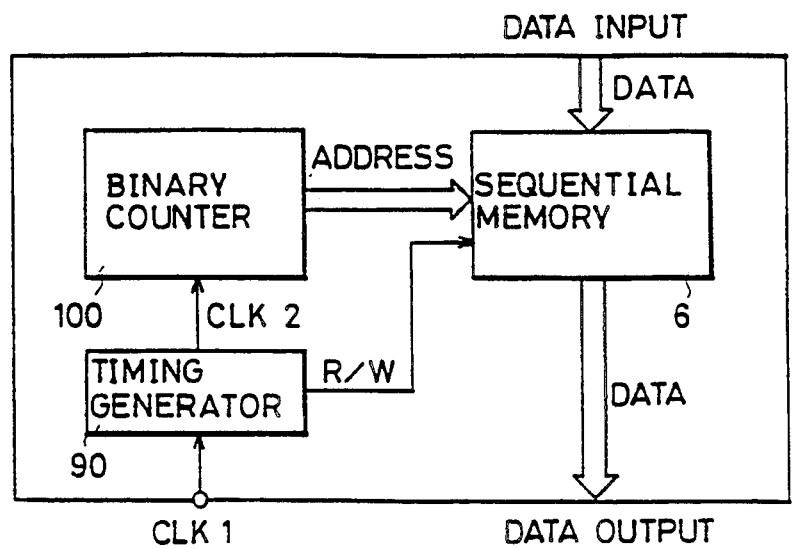
FIG. 13 is a block diagram of a conventional sequential memory device.

FIG. 1 is a block diagram of a sequential memory device according to an embodiment of the present invention. Referring to FIG. 1, this sequential memory device differs from that of FIG. 13 in that an address data generating device 7 is provided instead of binary counter 100. The sequential memory device may be formed on one chip. Address data generating device 7 comprises a setting circuit 3, a match detecting circuit 4, a selector group 5, and a binary counter 100a. If the address to be skipped is "N", a data of "N−1" is set by setting circuit 3. This address to be skipped is the address comprising the error bit detected in the examining step of sequential memory 6.

Match detecting circuit 4 detects the match of the address data provided from binary counter 100a with data "N−1" set by the setting circuit.

The selector group 5 provides "1" to binary counter 100a when a match is not detected by match detecting circuit 4, and "2" to binary counter 100a when a match is detected by match detecting circuit 4.

Binary counter 100a responds to clock signal CLK2 to add "1" or "2" provided from selector group 5 to the prior generated address data.

Figure 2:
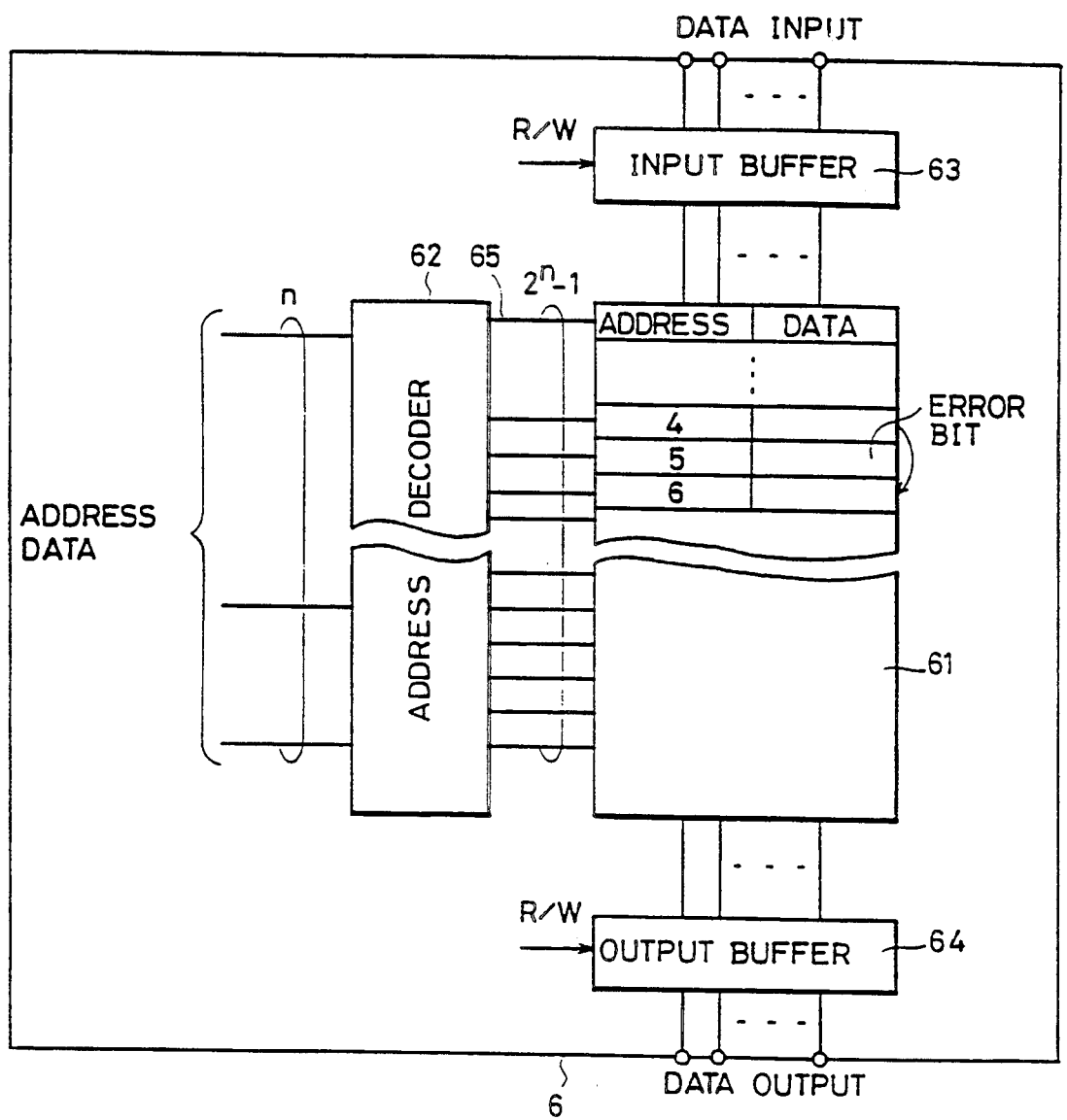
FIG. 2 is a block diagram showing in detail a sequential memory.

FIG. 2 is a block diagram showing in detail sequential memory 6. Referring to FIG. 2, sequential memory 6 comprises a memory array 61 storing a plurality of m-bit data, an address decoder 62 receiving address data from binary counter 100a (FIG. 1), an input buffer 63, and an output buffer 64. Address decoder 62 decodes the address data from binary counter 100a to sequentially select a plurality of select lines 65. When writing is specified by the read/write specifying signal R/W from timing generating circuit 90 (FIG. 1), input buffer 63 becomes active, whereby data are sequentially written into addresses corresponding to the sequentially selected select lines 65. When reading is specified by the read/write specifying signal R/W from timing generating circuit 90, output buffer 64 becomes active, whereby data written in addresses corresponding to the sequentially selected select lines 65 are read out sequentially.

Image memories (sequential memory) of 256K–64M bytes are commercially available. In the present embodiment, any of these may be used.

Figure 3:
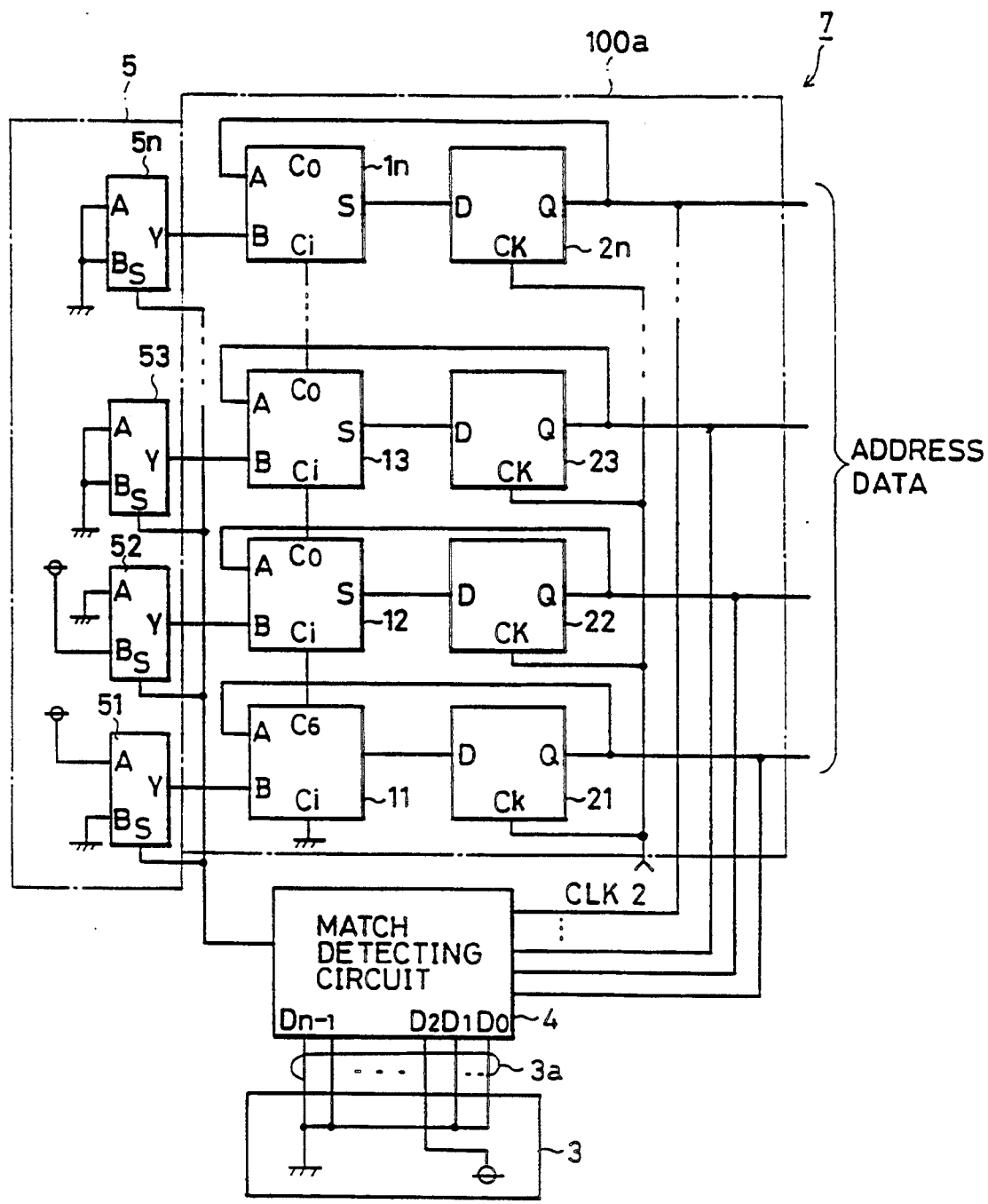
FIG. 3 is a block diagram showing an address data generating device.

FIG. 3 is a block diagram showing in detail each circuits of address data generating device 7. Referring to FIG. 3, binary counter 100a comprises adders 11, 12, . . . 1n, and flipflop circuits 21, 22, . . . 2n.

Figure 14:
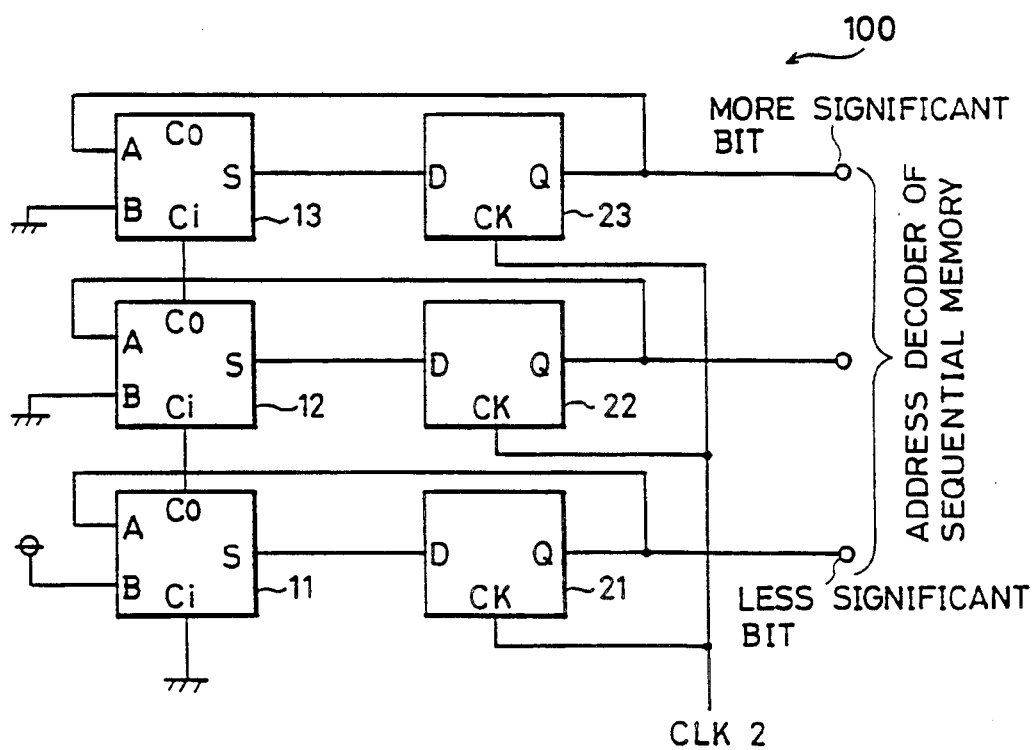
FIG. 14 is a block diagram showing a conventional binary counter.
Figure 15:
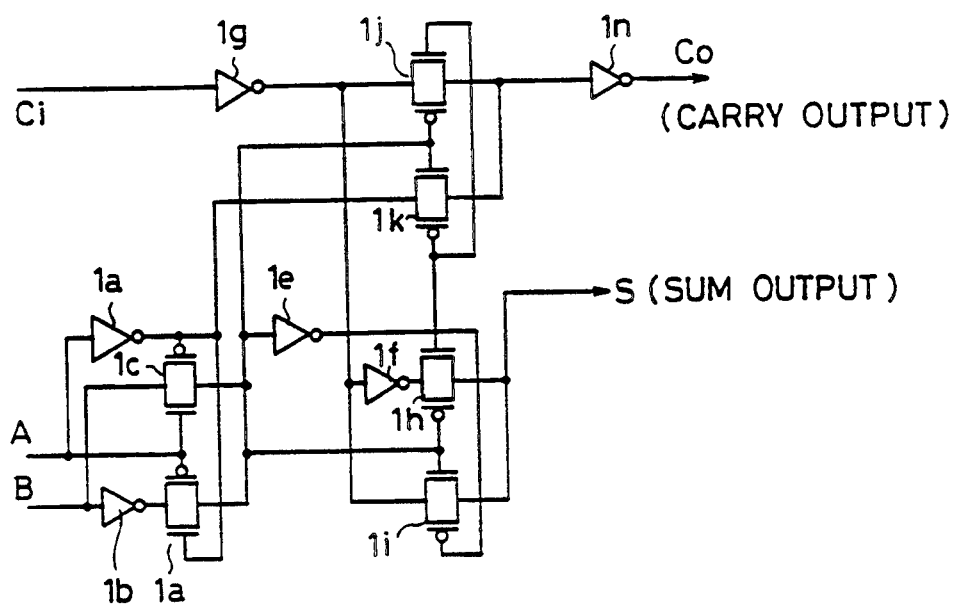
FIG. 15 is a circuit diagram showing the structure of an adder.

Binary counter 100a differs from binary counter 100 of FIG. 14 in that input terminals B of each adder is connected to selector group 5.

Setting circuit 3 comprises a plurality of interconnections 3a corresponding to the number of bits of the address data. Each interconnection 3a is coupled to power supply potential or ground potential. If the address to be skipped is "5" (refer to FIG. 2), "4" is set by setting circuit 3.

Figure 4:
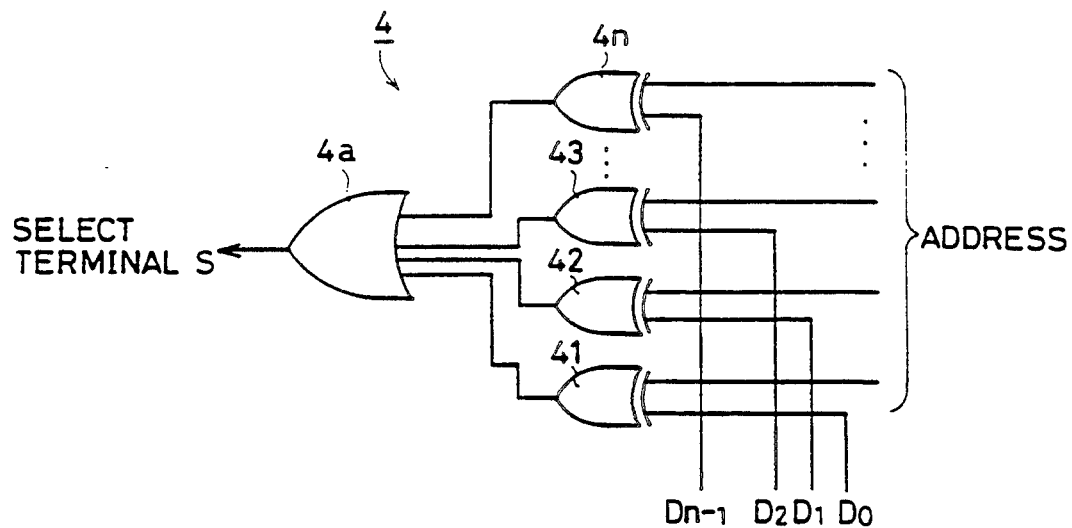
FIG. 4 is a circuit diagram of a match detecting circuit.

Referring to FIG. 4, match detecting circuit 4 comprises EX-OR gates 41, 42, . . . , 4n, and a multi-input OR gate 4a connected to the outputs of EX-OR gates. Each EX-OR gate provides "1" when the two input data match each other. Therefore, match detecting circuit 4 provides a match signal of a low level when an address data from binary counter 100a is equal to the data "N−1" set by setting circuit 3. This match signal is applied to selector group 5.

Selectors 51, 52, . . . , 5n comprise input terminals A and B, Output terminal Y, and select terminal S. Each of the selectors 51 to 5n provides the signal at input terminal A from output terminal Y, when the match signal from match detecting circuit 4 is at a high level. When the match signal from match detecting circuit 4 is at a low level, the signal at input terminal B is provided from output terminal Y. Although a transmission gate is typical for selector 5, various types that are commercially available can be used.

The operation of the sequential memory device of FIGS. 1–4 are explained hereinafter.

It is presumed that there is error in address "5" of sequential memory 6 and this address is to be skipped. Data "4" is set by setting circuit 3, whereby data "1", "0", "0" are applied to the input terminals D2, D1, D0 of EX-ORs 41, 42 and 43 of match detecting circuit 4, respectively, and data "0" is applied to the input terminals of the remaining EX-OR gates.

Next, D-FFs 21, 22, ..., 2n commences the count of the clock pulses of clock signal CLK2. It is presumed that an address data provided from binary counter 100a is now "3". At this time, match detecting circuit 4 provides a high level match signal to select terminals S of selectors 51 to 5n because the set data "4" does not match the address data "3". The selectors 51 to 5n maintain the previous logic state. Therefore, adder 11 increments "1" to the previous logic state to obtain the value of "0", whereby a carry flag "1" is provided to adder 12. Adder 12 adds carry flag "1" from adder 11 to the previous logic state of "0" to result in "0", whereby a carry flag "1" is provided to adder 13. The outputs of adders 11, 12 and 13 become "0", "0", "1", respectively.

In response to clock signal CLK2, D-FFs 21, 22, ... 2n provide the outputs of adders 11, 12, ..., 1n from the output terminals Q to sequential memory 6 and match detecting circuit 4 as an address data "4". Because the address data "4" matches the set data "4", match detecting circuit 4 provides a low level match signal to each select terminal S of selectors 51, 52, ..., 5n. Selectors 51 to 5n are responsive to the low level match signal to provide signals at input terminals B to adders 11 to 1n. Thus, the output of adder 11 remains at the previous logic state "0". The output of adder 12 is incremented by "1". This is equivalent to adding "2" to the previous logic state, and the outputs of adders 11, 12, and 13 become "0", "1", "1", respectively. In response to clock signal CLK2, D-FFs 21, 22, ..., 2n provide the outputs of adders 11, 12, ..., 1n to sequential memory 6 and match detecting circuit 4 as an address data "6".

Thus, the address data "5" is skipped in accordance with the aforementioned operation, whereby the memory device having error in address "5" can be used without being exchanged.

Figure 5:
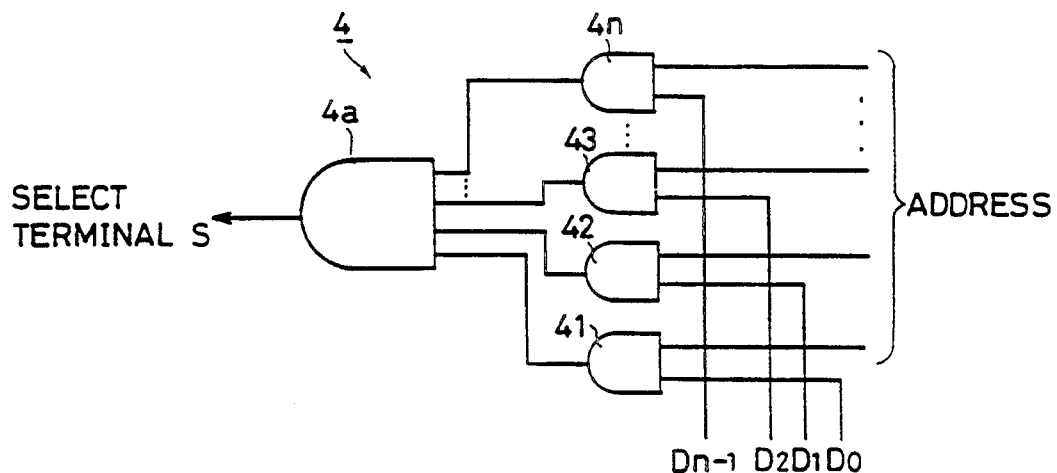
FIGS. 5 and 6 are circuit diagrams showing modifications of the match detecting circuit.

FIG. 5 is a circuit diagram of a modification of the match detecting circuit 4 of FIG. 4. This embodiment differs from the embodiment of FIG. 4 in that AND 41 to 4n and 4a gates are used instead of EX-OR gates and the OR gate. The match detecting circuit implemented by AND gates can detect the match of an address data with the set data of input terminals D0, D1, D2, ..., Dn, similar to the embodiment of FIG. 4. By obtaining a logical product with the multi-input AND gate 4a, the match signal similar to that of the match detecting circuit of FIG. 4 can be provided.

Figure 6:
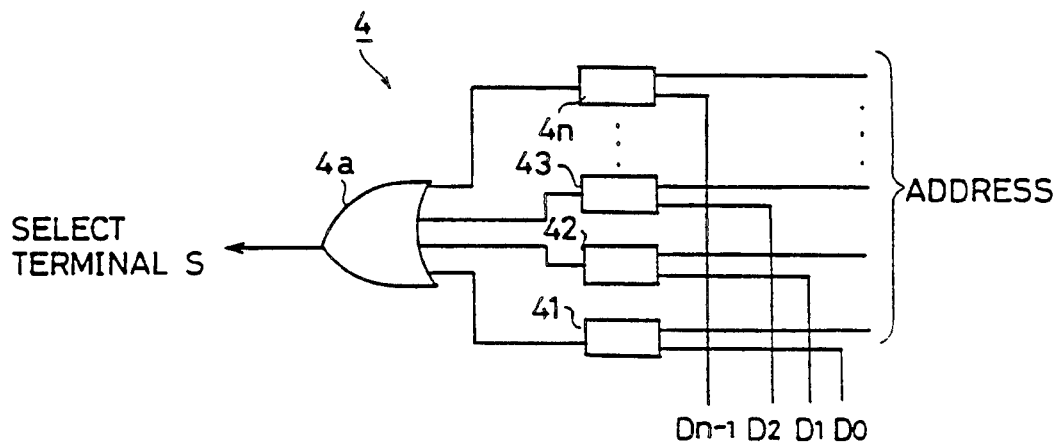

FIG. 6 is a circuit diagram of a match detecting circuit using subtraction circuits 41 to 4n. This match detecting circuit can also provide a match signal similar to those of the match detecting circuit of FIGS. 4 and 5. As shown in FIGS. 4, 5, and 6, it is possible to apply various design modifications to the match detecting circuit as long as it can detect the match of the set data with the address data.

Figure 7:
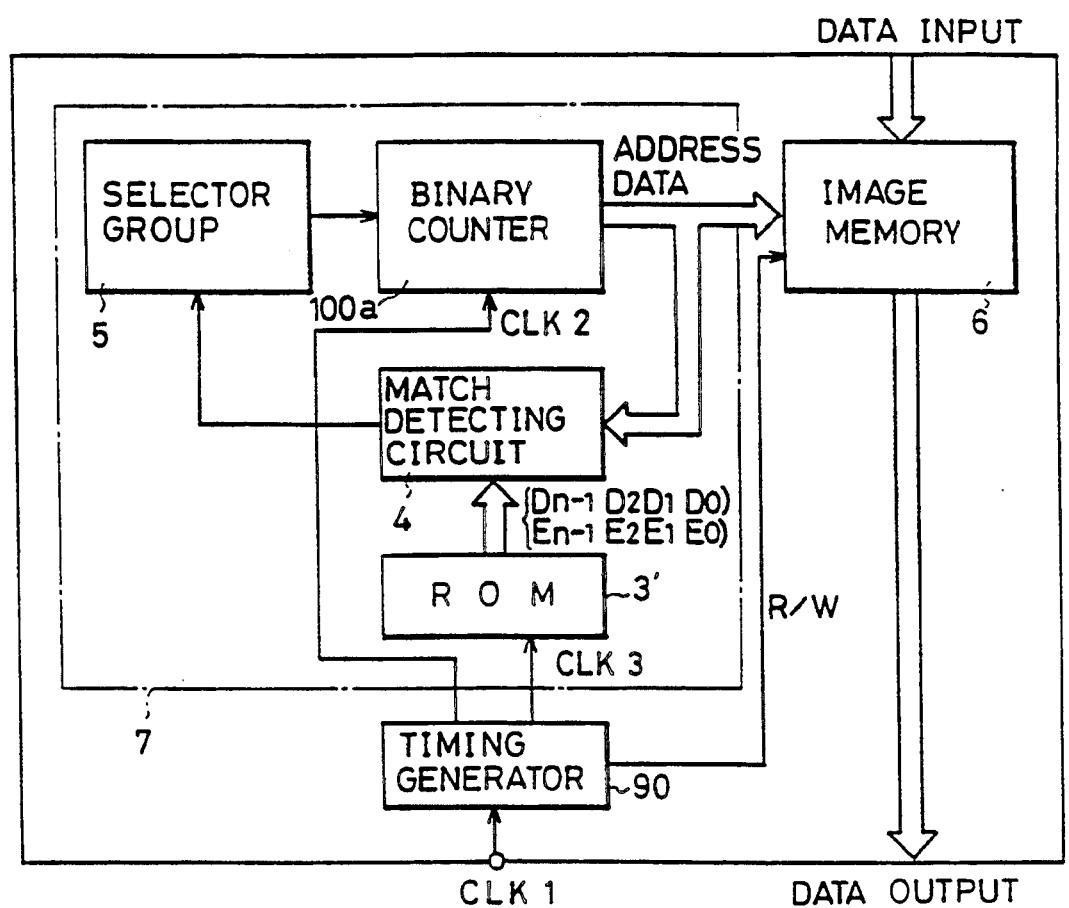
FIG. 7 is a circuit diagram showing another embodiment of the present invention.
Figure 8:
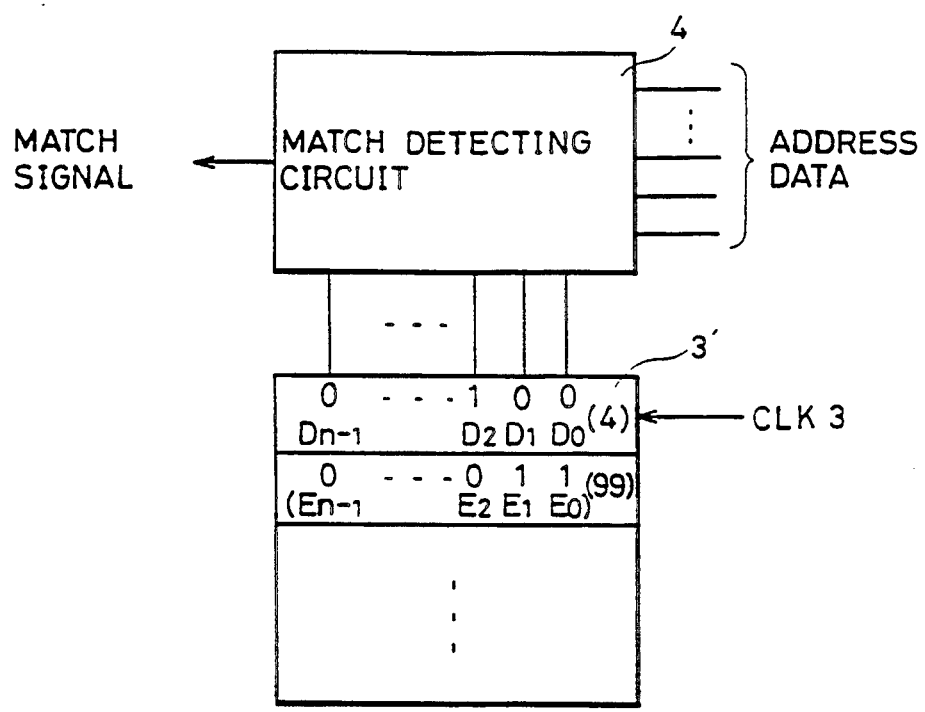
FIG. 8 is a diagram for explaining data written into a ROM 3'.
Figure 9:
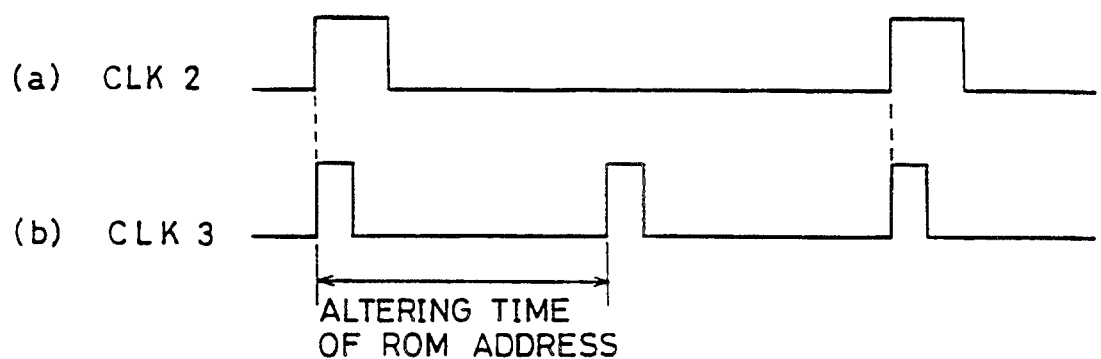
FIG. 9 is a diagram for explaining the read out timing of a ROM 3'.

FIG. 7 is a block diagram showing another embodiment of the sequential memory device of the present invention. Referring to FIG. 7, the sequential memory device differs from that of FIG. 1 in that a ROM 3' capable of setting a plurality of data is provided instead of setting circuit 3 setting a single data. ROM 3' is provided with a clock signal CLK3. As shown in FIG. 8, data "4" and "99" corresponding to addresses "5" and "100", for example, are written into ROM 3'. In response to clock signal CLK3 indicated in FIG. 9, data "4" and "99" are read out. The frequency of clock signal CLK3 is set to at least two times the frequency of clock signal CLK2. Data "4" and "99" are read out during one period of clock signal CLK2. When there are three addresses to be skipped, the frequency of clock signal CLK3 is set to three times the frequency of clock signal CLK2. With such an implementation, a plurality of data each corresponding to the preceding address may be set by ROM 3' when there are error bits in a plurality of addresses in sequential memory 6. Match detecting circuit 4 detects the match of the set data with the address data. When a match is detected, match detecting circuit 4 supplies a match signal to selector group 5, whereby selector group 5 supplies "2" to binary counter 100a. Binary counter 100a alters the address data by "2". In accordance with the present embodiment, the memory does not have to be exchanged even if there are a plurality of error bits.

Figure 10:
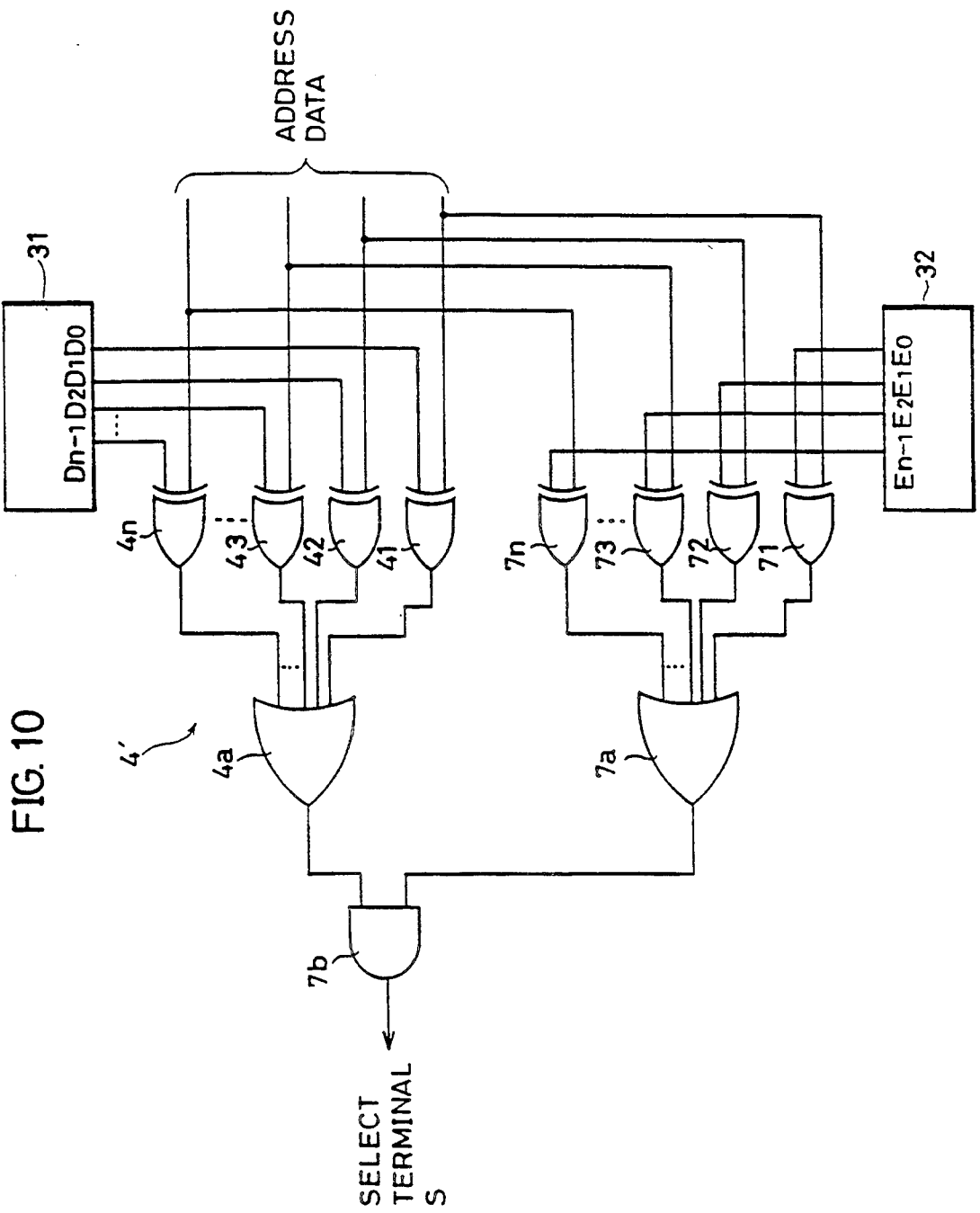
FIG. 10 is a circuit diagram showing a modification of a match detecting circuit.

FIG. 10 is a circuit diagram of another example of match detecting circuit 4. This match detecting circuit 4' comprises EX-OR gates 41, 42, ... 4n, an OR gate 4a, as well as EX-OR gates 71, 72, ..., 7n, an OR gate 7a, and an AND gate 7b.

With match detecting circuit 4', comparison of the set data of terminals $D_{n-1}$ to $D_0$ with the address data, and the set data of terminals $E_{n-1}$ to $E_0$ with the address data can be carried out simultaneously. By providing two setting circuits 31 and 32, skipping two address data is possible.

Figure 11:
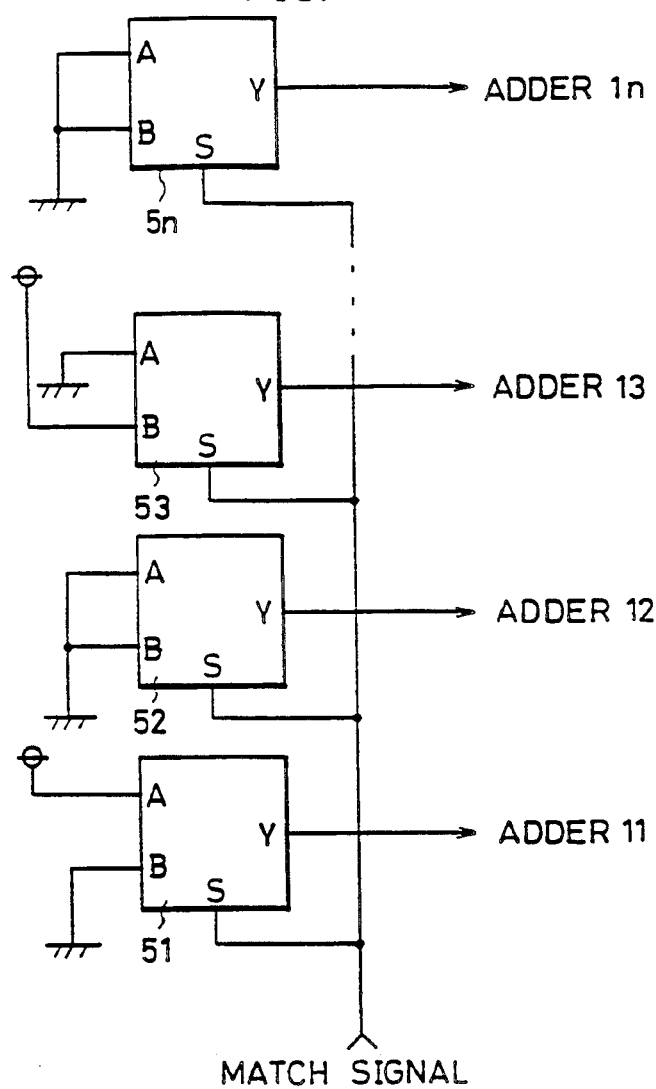
FIG. 11 is a circuit diagram of a modification of a selector group.

FIG. 11 is a circuit diagram of a modification of selector group 5. Referring to FIG. 11, this selector group 5 differs from that of FIG. 3 in that input terminal B of selector 52 is grounded, and input terminal B of selector 53 is coupled to power supply potential. If a match signal is provided, "0", "0", "1" are provided from selectors 51, 52, and 53, respectively. Therefore, "4" is provided to adders 11–13. Thus, it is possible to skip three consecutive addresses. By modifying the connection of input terminals A and B of each selector, addresses that may be consecutively skipped can be set arbitrarily.

Figure 12:
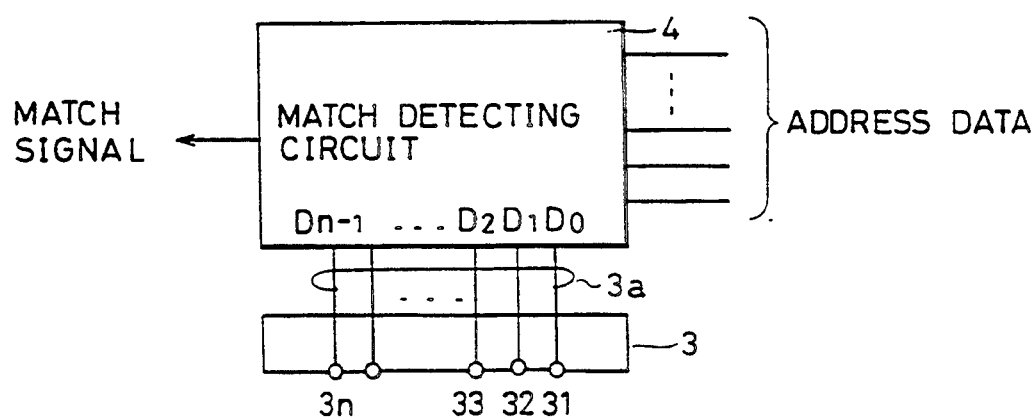
FIG. 12 is a circuit diagram of a modification of a setting circuit.

FIG. 12 is a circuit diagram of a modification of setting circuit 3. This setting circuit 3 comprises external terminals 31-3n, and interconnections 3a connected to external terminals 31-3n. With this setting circuit 3, a user can set the desired data because an arbitrary potential can be applied from an external source to set the data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data generating apparatus sequentially generating data, the apparatus comprising:
   data generating means responsive to a clock signal for sequentially generating data, each data being a plurality of bits;
   setting means for designating a first data having a constant relationship to a second data;
   detecting means for detecting one of match and mismatch between one of said data generated by said data generating means and said first data of said setting means and generating one of match and mismatch signals;

selecting means for selecting a first value in response to said mismatch signal and selecting a second value in response to said match signal, said selecting means having a plurality of selectors, each selector corresponding to one of said plurality of bits and having first and second input terminals for receiving data of one of logic 1 and logic 0, for outputting the data received at said first input terminal in response to said mismatch signal and for outputting the data received at said second input terminal in response to said match signal; and adding means for altering the data generated from said data generating means by one of the first and second values selected by said selecting means, said adding means having a plurality of adders, each adder corresponding to one of said plurality of bits and having a first data input terminal, a second data input terminal, a carry input terminal, a carry output terminal and a data output terminal for receiving the output of a corresponding selector of said plurality of selectors, wherein said data generating means includes data holding means for holding the data altered by said adding means and outputting the data altered in response to said clock signal and said data holding means having a plurality of D type flipflops, each flipflop corresponding to one of said plurality of bits and having a data input terminal connected to the data output terminal of corresponding adder, a clock terminal for receiving said clock signal, and a data output terminal connected to said second data input terminal of the corresponding adder, said carry output terminal of each of said adder is connected to the input terminal of the adder corresponding to a more significant bit of said plurality of bits.

2. A sequential memory device comprising:

memory means for storing a plurality of data, address signal generating means responsive to a clock signal for sequentially generating an address signal for specifying an address of said memory means, specifying signal generating means for generating a write specifying signal for specifying writing and a read specifying signal for specifying reading, write means responsive to said write specifying signal and the address signal generated from said address signal generating means for writing data into the specified address of said memory means, read means responsive to said read specifying signal and an address signal generated from said address signal generating means for reading out data from the specified address data of said memory means, setting means for setting a first address signal having a constant relationship to a second address signal, wherein said second address signal has a value N and said first address signal has a value (N−M), where M is an integer not less than zero, detecting means for detecting a predetermined relationship between one of the address signals generated by said address signal generating means and the first address signal of said setting means, and altering means for altering by a first value an address signal to be generated from said address signal generating means when said predetermined relationship is not detected by said detecting means, and for altering by a second value, which is greater than the value M, an address signal to be generated from said address signal generating means when said predetermined relationship is detected by said detecting means such that the second address signal having the value N is skipped during sequential generation of address signals by said address signal generating means.

3. A sequential memory device according to claim 2, wherein said first address signal having the constant relationship is equal to an address signal preceding the second address signal to be skipped, said predetermined relationship, is a match between the address signal generated by said address signal generating means and said first address signal.

4. A data generating apparatus sequentially generating data, comprising:

data generating means responsive to a clock signal for sequentially generating data, setting means for designating first data having a constant relationship to second data, wherein said second data has a value N and said first data has a value (N−M), M being an integer not less than zero, detecting means for detecting a predetermined relationship between one of said data generated by said data generating means and said first data designated by said setting means, and altering means for altering by a first value the data to be generated from said data generating means when said predetermined relationship is not detected by said detecting means, and altering by a second value, which is greater than the value M, the data to be generated from said data generating means when said predetermined relationship is detected by said detecting means such that the second data having the value N is skipped during sequential generation of the data by said data generating means.

5. The data generating apparatus according to claim 4, wherein said first data having said constant relationship with said second data is equal to a data preceding the second data which is skipped, and said predetermined relationship is a match between one of said data generated by said data generating means and first data.

6. The data generating apparatus according to claim 5, wherein said detecting means generates a match signal when said match is detected, and a mismatch signal when said match is not detected, said altering means comprises selecting means for selecting said first value in response to said mismatch signal, and selecting said second value in response to said match signal, and adding means for adding one of said first and second values selected by said selecting means to said data generated from said data generating means.

7. The data generating apparatus according to claim 6, wherein said data generating means comprises data holding means receiving a data added by said adding means for holding and outputting said data in response to said clock signal.

8. The data generating apparatus according to claim 7, wherein said data includes a plurality of bits, said selecting means comprises a plurality of selectors, each selector corresponding to one of said plurality of bits and having first and second input terminals for receiving data of one of logic 1 and logic 0, for outputting the data received at said first input terminal in response to said mismatch signal and for outputting the data received at said second input terminal in response to said match signal, said adding means includes a plurality of adders, each adder corresponding to one of said plurality of bits and having a first data input terminal, a second data input terminal, a carry input terminal, a carry output terminal, and a data output terminal for receiving the output of the corresponding selector, said data holding means includes a plurality of D type flipflops, each flipflop corresponding to one of said plurality of bits and having a data input terminal connected to the data output terminal of the corresponding adder, a clock terminal for receiving said clock signal, and a data output terminal connected to said second data input terminal of the corresponding adder, said carry output terminal of each of said adder is connected to the input terminal of the adder corresponding to a more significant bit of said plurality of bits.

9. The data generating apparatus according to claim 4, wherein
said first data is a first plurality of data,
said second data is a second plurality of data,
said setting means stores the first plurality of data each having a constant relationship to each of the second plurality of data to be skipped,
said detecting means for detecting said predetermined relationship between a data generated from said data generating means with at least one of said first plurality of data.

10. The data generating apparatus according to claim 9, wherein said setting means comprises non-volatile memory means for storing the first plurality of data and sequentially reading out said first plurality of data in response to said clock signal.

11. The data generating apparatus according to claim 4, wherein
said data includes a plurality of bits and first data includes a first plurality of bits,
said detecting means includes
a plurality of comparing means each for comparing a corresponding bit of the first data set with the corresponding bit of the data generated by said data generating means,
determining means for determining whether all the comparison results of each of said comparing means indicate a match or not to generate a match signal when all comparison results indicate a match and a mismatch signal when at least one comparison result indicates a mismatch.

12. The data generating apparatus according to claim 11, wherein
each of said plurality of comparing means comprises an EX-OR gate,
said determining means comprises a multi-input OR gate connected to the output of each said EX-OR gate.

13. The data generating apparatus according to claim 1, wherein
each of said plurality of comparing means comprises an AND gate,
said determining means comprises a multi-input AND gate connected to the output of each said AND gate.

14. The data generating apparatus according to claim 11, wherein
each of said plurality of comparing means comprises subtracting means,
said determining means comprises a multi-input OR gate connected to the output of each said subtracting means.

15. The data generating apparatus according to claim 4, wherein said setting means comprises a plurality of interconnections each connected to one of a power supply potential and ground potential.

16. The data generating apparatus according to claim 4, wherein said setting means comprises a plurality of external terminals each receiving one of a power supply potential and ground potential.

17. The data generating apparatus according to claim 4, wherein said setting means comprises non-volatile memory means for storing the first data having said constant relationship to the second data to be skipped.

18. The data generating apparatus according to claim 4, wherein
said first value is 1, and
said second value is at least 2.

19. An address data generating apparatus sequentially generating address data for specifying an address of a memory device, comprising:
address data generating means responsive to a clock signal for sequentially generating the address data,
setting means for designating a first address data having a constant relationship to a second address data, wherein said second address data has an address value N and said first address data has an address value (N−M), where M is an integer not less than zero,
detecting means for detecting a predetermined relationship between one of the address data generated by said address data generating means and the first address data of said setting means, and
altering means for altering by a first value the address data to be generated from said address data generating means when said predetermined relationship is not detected by said detecting means, and for altering by a second value, which is greater than the value M, the address data to be generated by said address data generating means when said predetermined relationship is detected by said detecting means such that the second address data having the address value N is skipped during sequential generation of the address data by said address data generating means.

20. The address data generating apparatus according to claim 19, wherein
said first data is equal to an address data preceding the second address data which is skipped,
said predetermined relationship is a match between one of the address data generated by said address data generating means.

21. An on-chip data generating apparatus sequentially generating data, comprising:
data generating means for generating data,
setting means for setting a first data having a constant relationship to a second data, wherein said second data has a value N and said second data has a value (N−M), where M is an integer less than zero, detecting means for detecting a predetermined relationship between one of the data generated by said data generating means and said first data set by said setting means, and updating means for altering sequentially at a constant rate in response to a clock signal the data to be generated from said data generating means by a first value when said predetermined relationship is not detected by said detecting means, and for decelerating the altering of said data when said predetermined relationship is detected by said detecting means by a second value, which is greater than the value M, such that the second data having the value N skipped during sequential generation of said data by said data generating means.

22. A data generating apparatus for sequentially generating data and skipping over data corresponding to a location of a memory having defects, the apparatus comprising:

data generating means for sequentially generating data;

setting means for setting a first data having a predetermined relationship to a second data to be skipped corresponding to the location of the memory having defects, wherein said second data has a value N and said first data has a value (N−M), where M is an integer not less than zero;

detecting means for detecting a match between the first data and the data generated by said data generating means;

means for altering the data generated by said data generating means, said altering means generating a first value when said detecting means detects no match between the first data and the data, and said data generating means adding said first value to the data to generate data sequentially, wherein said altering means generates a second value which is greater than the value M and is based on said predetermined relationship when said detecting means detects the match, and said data generating means adding said second value to data generated by the data generating means such that second data having the value N, which corresponds to the location of the memory having defects, is skipped over by said data generating means.

23. An address data generating apparatus for generating sequentially address data and skipping over an address data corresponding to an error position in a memory, the apparatus comprising:

data generating means responsive to a clock signal for sequentially generating address data;

set data output means for setting first address data equal to an address data preceding the address data corresponding to said error position in the memory and constantly outputting said first address data when said set data output means is accessed so that said data generating means generates the address data sequentially in response to the clock signal, said first address data having a value (N−M) and the address data corresponding to said error position having a value N, where M is an integer not less than zero;

match detecting means for detecting a match between address data sequentially generated by said data generating means and first address of data said set data output means; and altering means for altering said sequentially generated address data by a first value when a match is not detected by said match detecting means, and altering said sequentially generated address data by a second value which is greater than the value M so as to skip over said address data having the value N, which corresponds to said error position, when a match is detected by said match detecting means.

24. A method of operating a data generating apparatus sequentially generating data, the method comprising the steps of:

sequentially generating data in response to a clock signal, setting first data having a constant relationship to a second data, wherein said second data has a value N and said first data has a value (N−M), where M is an integer not less than zero, detecting a predetermined relationship between said generated data and said first data, and altering by a first value the data to be generated when said predetermined relationship is not detected, and altering by a second value, which is greater than the value M, the data to be generated when said predetermined relationship is detected such that the second data having the value N is skipped during sequential generation of the data.

25. A method of operating an address data generating apparatus sequentially generating an address data specifying an address in a memory device, the method comprising the steps of:

sequentially generating the address data in response a clock signal, setting a first address data having a constant relationship to a second address data, wherein said second address data has a value N and said first address data has a value (N−M), where M is an integer not less than zero, detecting a predetermined relationship between said generated address data and said first data, and altering by a first value an address data to be generated when said predetermined relationship is not detected, and altering by a second value, which is greater than the value M, the address data to be generated when said predetermined relationship is detected such that the second address data having the value N is skipped during sequential generation of the address data.

26. A method of operating a sequential memory device comprising memory means for storing a plurality of data, the method comprising the steps of:

sequentially generating an address signal for specifying an address of said memory means in response to a clock signal, generating a write specifying signal specifying writing and a read specifying signal specifying reading, writing data into the specified address of said memory means in response to said write specifying signal and said generated address signal, reading out data from the specified address of said memory means in response to said read specifying signal and said generated address signal, setting a first address signal having a constant relationship to a second address signal, wherein said second address signal has a value N and said first address signal has a value (N−M), where M is an integer not less than zero, detecting a predetermined relationship between said generated address signal and said first address signal, and altering by a first value an address signal to be generated when said predetermined relationship is not detected, and altering by a second value, which is greater than the value M, an address signal to be generated when said predetermined relationship is detected such that said second address signal having the value N is skipped during sequential generation of the address signal.

* * * * *